(12) United States Patent
Sheu

(10) Patent No.: US 9,099,577 B2
(45) Date of Patent: Aug. 4, 2015

(54) PHOTOELECTRIC MODULE

(71) Applicant: HON HAI PRECISION INDUSTRY CO., LTD., New Taipei (TW)

(72) Inventor: Yi-Zhong Sheu, New Taipei (TW)

(73) Assignee: HON HAI PRECISION INDUSTRY CO., LTD., New Taipei (TW)

( * ) Notice: Subject to any disclaimer, the term of this patent is extended or adjusted under 35 U.S.C. 154(b) by 132 days.

(21) Appl. No.: 13/906,371

(22) Filed: May 31, 2013

(65) Prior Publication Data

US 2014/0138812 A1    May 22, 2014

(30) Foreign Application Priority Data

Nov. 22, 2012    (TW) .............................. 101143658 A

(51) Int. Cl.
*G02B 6/42* (2006.01)
*H01L 31/0203* (2014.01)
*H01L 25/04* (2014.01)
*H01L 23/00* (2006.01)
*H01S 5/022* (2006.01)

(52) U.S. Cl.
CPC .......... *H01L 31/0203* (2013.01); *H01L 25/042* (2013.01); *H01L 24/48* (2013.01); *H01L 2224/48091* (2013.01); *H01L 2224/48227* (2013.01); *H01S 5/02216* (2013.01); *H01S 5/02284* (2013.01); *H01S 5/02292* (2013.01)

(58) Field of Classification Search
CPC ...... G02B 6/02; G02B 6/4201; G02B 6/4246; G02B 6/4248
See application file for complete search history.

(56) References Cited

U.S. PATENT DOCUMENTS 5,479,540 A * 12/1995 Boudreau et al. ............... 385/14

* cited by examiner

*Primary Examiner* — Jae Lee
(74) *Attorney, Agent, or Firm* — Novak Druce Connolly Bove + Quigg LLP

(57) ABSTRACT

A photoelectric module includes a lower substrate, an upper substrate, a photoelectric module, and a hermetical structure. The lower substrate includes a reflecting surface and defines a receiving hole facing the reflecting surface. The photoelectric module is mounted on the upper substrate and faces the reflecting surface. The hermetical structure includes a first hermetical part and a second hermetical part, the first hermetical part is positioned on the lower substrate, and the second hermetical part is positioned on the upper substrate. The photoelectric module is surrounded by the hermetical structure.

11 Claims, 2 Drawing Sheets

# PHOTOELECTRIC MODULE

BACKGROUND

1. Technical Field

The present disclosure relates to photoelectric modules and, particularly, to a photoelectric module having a hermetical space.

2. Description of Related Art

Photoelectric modules generally include a circuit board and a number of photoelectric elements, such as laser diodes and photo diodes, mounted on the circuit board. The circuit board is made from epoxy, which is a superabsorbent material, and keeps releasing water molecules, which may cause the photoelectric elements to malfunction.

Therefore, it is desirable to provide a photoelectric module, which can overcome the limitations described.

DETAILED DESCRIPTION

Embodiments of the disclosure will be described with reference to the drawings.

Figure 1:
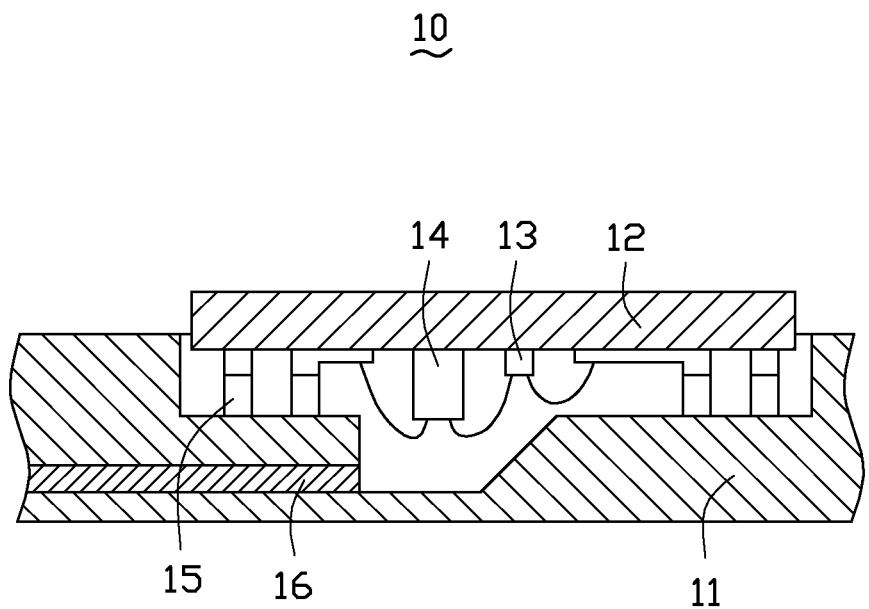
FIG. 1 is a schematic view of a photoelectric module in accordance with an exemplary embodiment.
Figure 2:
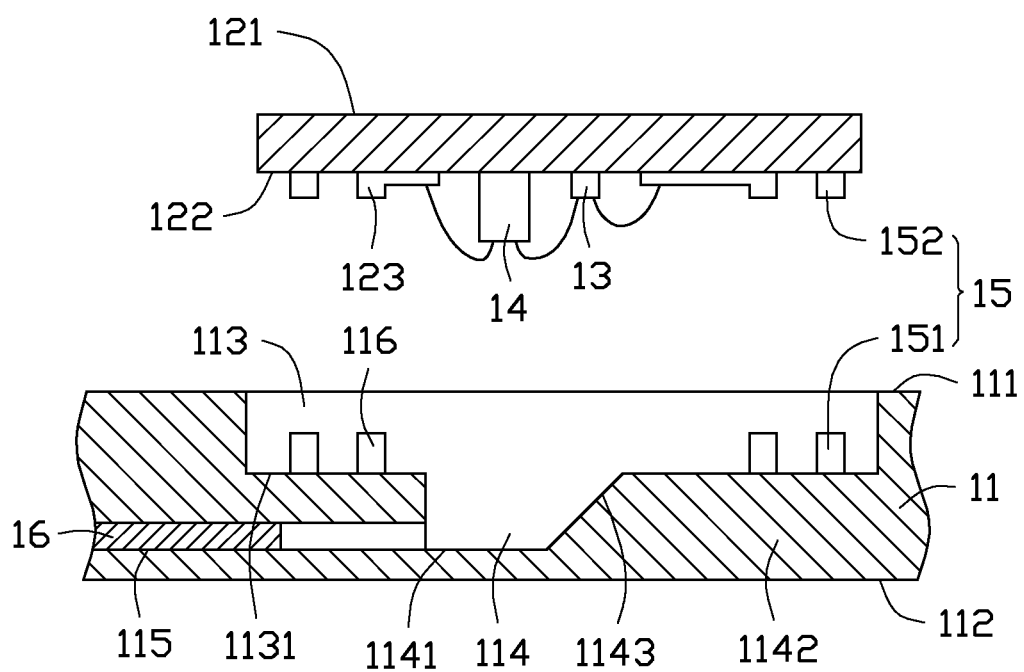
FIG. 2 is an exploded view of the photoelectric module of FIG. 1.

FIGS. 1-2 show a photoelectric module 10 according to an exemplary embodiment. The photoelectric module 10 includes a lower substrate 11, an upper substrate 12, a photoelectric module 13, a chip 14, a hermetical structure 15, and an optical fiber 16.

The lower substrate 11 includes an upper surface 111 and a lower surface 112 opposite to the upper surface 111. The lower substrate 11 defines a first recess 113 on the upper surface 111. The first recess 113 forms a first bottom surface 1131, which is substantially parallel with the upper surface 111. The lower substrate 11 defines a second recess 114 on the first bottom surface 1131. The second recess 114 forms a second bottom surface 1141, which is substantially parallel with the upper surface 111.

A reflecting portion 1142 extends upward from the second bottom surface 1141. The reflecting portion 1142 includes a reflecting surface 1143 inclining from the first bottom surface 1131 to the second bottom surface 1141 at about 45 degrees. The lower substrate 11 defines a receiving hole 115 extending along a direction that is substantially parallel with the upper surface 111, communicating with the second recess 114, and positioned at a side of the second recess 114 opposite to the reflecting portion 1142. In the embodiment, the receiving hole 115 is adjacent to the second bottom surface 1141.

A number of first electrical pads 116 are positioned on the first bottom surface 1131. The first electrical pads 116 connect to circuits (not shown) formed in the lower substrate 11.

The upper substrate 12 includes a top surface 121 and a bottom surface 122 opposite to the top surface 121. An external diameter of the upper substrate 12 is less than an internal diameter of the first recess 113.

A number of second electrical pads 123 are positioned on the bottom surface 122. Positions of the second electrical pads 123 correspond to positions of the first electrical pads 116. In this embodiment, the lower substrate 11 and the upper substrate 12 are circuit boards.

The photoelectric module 13 is mounted on the bottom surface 122 of the upper substrate 12. The photoelectric module 13 is electrically connected to a part of the second electrical pads 123. The photoelectric module 13 is configured for converting electrical signals to light rays or converting light rays to electrical signals. In the embodiment, the photoelectric module 13 includes a first element (not shown), such as a laser diode, for converting the electrical signals to the light rays and a second element (not shown), such as a photo diode, for converting the light rays to the electrical signals.

The chip 14 is mounted on the bottom surface 122 of the upper substrate 12. The chip 14 is electrically connected to the photoelectric module 13 and another part of the second electrical pads 123. The chip 14 is configured for inputting or outputting the electrical signals.

The hermetical structure 15 includes a first hermetical part 151 and a second hermetical structure 152. The first hermetical part 151 and the second hermetical structure 152 are annular shaped, and are made of hydrophobic metal, such as nickel, copper, and titanium. The first hermetical part 151 is positioned on the first bottom surface 1131 of the lower substrate 11, and the first electrical pads 116 are surrounded by the first hermetical part 151. The second hermetical part 152 is positioned on the bottom surface 122 of the upper substrate 12, and the photoelectric module 13, the chip 14, and the second electrical pads 123 are surrounded by the second hermetical part 152.

In the embodiment, the first hermetical part 151 and the second hermetical part 152 are bonded by a transient liquid phase or an Au—Sn electroplated technology. The photoelectric module 13 and the chip 14 are surrounded between the lower substrate 11 and the upper substrate 12 by the hermetical structure 15.

The optical fiber 16 is received in the receiving hole 115, and one end of the optical fiber 16 is level with one end of the receiving hole 115 adjacent to the second recess 114. The optical fiber 16 is configured for transmitting the light rays.

During assembling, the upper substrate 12 is received in the first recess 113 of the lower substrate 11. The photoelectric module 13 faces the reflecting surface 1143 of the reflecting portion 1142. The first electrical pads 116 are electrically connected to the second electrical pads 123. The first hermetical part 151 is contacted with the second hermetical structure 152.

In use, light rays emitted from the optical fiber 16 project on the reflecting surface 1143 of the reflecting portion 1142. The reflecting surface 1143 reflects the light rays to the photoelectric module 13. The photoelectric module 13 converts the light rays to the electrical signals. The electrical signals are input to the chip 14. The electrical signals are output to other elements from the chip 14 via the first electrical pads 116 and the second electrical pads 123. Likewise, the electrical signals are input to the chip 14 from other elements via the first electrical pads 116 and the second electrical pads 123. The chip 14 outputs the electrical signals to the photoelectric module 13. The photoelectric module 13 converts the electrical signals to the light rays. The reflecting surface 1143 reflects the light rays to the optical fiber 16. The optical fiber 16 transmits the light rays to an electrical device (not shown).

As the lower substrate 11, the upper substrate 12, and the hermetical structure 15 form a hermetical room, a part of the lower substrate 11 and a part of the upper substrate 12 surrounding the hermetical room are separated with the outside. This part of the lower substrate 11 and this part of the upper substrate 12 will not release water molecules, the reliability of the photoelectric module 13 and the chip 14 will be increased.

Particular embodiments are shown and are described by way of illustration only. The principles and the features of the present disclosure may be employed in various and numerous embodiments thereof without departing from the scope of the disclosure as claimed. The above-described embodiments illustrate the scope of the disclosure but do not restrict the scope of the disclosure.

What is claimed is:

1. A photoelectric module, comprising:
a lower substrate comprising a reflecting surface and an upper surface, the lower substrate defining a receiving hole facing the reflecting surface, and defining a first recess on the upper surface;
an upper substrate received in the first recess;
a photoelectric module mounted on the upper substrate and facing the reflecting surface; and
a hermetical structure comprising a first hermetical part and a second hermetical part, the first hermetical part positioned on the lower substrate, the second hermetical part positioned on the upper substrate and touching the first hermetical part, the photoelectric module surrounded by the hermetical structure.

2. The photoelectric module of claim 1, wherein the lower substrate comprises a lower surface opposite to the upper surface, the first recess comprises a first bottom surface, the lower substrate defines a second recess on the first bottom surface, the second recess comprises a second bottom surface.

3. The photoelectric module of claim 2, wherein the lower substrate comprises a reflecting portion extending upward from the second bottom surface, and the reflecting surface is positioned on the reflecting portion.

4. The photoelectric module of claim 3, wherein the reflecting surface inclines from the first bottom surface to the second bottom surface at about 45 degrees.

5. The photoelectric module of claim 2, wherein the first hermetical part is positioned on the first bottom surface.

6. The photoelectric module of claim 2, wherein the upper substrate comprises a top surface and a bottom surface opposite to the top surface, and the photoelectric module is mounted on the bottom surface.

7. The photoelectric module of claim 2, wherein an external diameter of the upper substrate is less than an internal diameter of the first recess.

8. The photoelectric module of claim 2, wherein the receiving hole extends along a direction that is substantially parallel with the upper surface, is communicated with the second recess, and is located at a side of the second recess opposite to the reflecting surface.

9. The photoelectric module of claim 1, wherein the first hermetical part and the second hermetical part are annular shaped and are made of hydrophobic metal.

10. The photoelectric module of claim 1, further comprising a chip mounted on the upper substrate, wherein the photoelectric module is electrically connected to the chip, and the chip is surrounded by the hermetical structure.

11. The photoelectric module of claim 10, wherein the chip is mounted on the bottom surface of the upper substrate.

* * * * *